United States Patent
Li et al.

(10) Patent No.: US 11,608,267 B2
(45) Date of Patent: Mar. 21, 2023

(54) METHOD FOR MAKING TRANSITION METAL DICHALCOGENIDE CRYSTAL

(71) Applicants: Tsinghua University, Beijing (CN); HON HAI PRECISION INDUSTRY CO., LTD., New Taipei (TW)

(72) Inventors: Hao Li, Beijing (CN); Yang Wu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 121 days.

(21) Appl. No.: 17/328,227

(22) Filed: May 24, 2021

(65) Prior Publication Data
US 2022/0033261 A1    Feb. 3, 2022

(30) Foreign Application Priority Data
Jul. 31, 2020   (CN) .......................... 202010763310.4

(51) Int. Cl.
   *C30B 25/08*   (2006.01)
   *C01B 19/00*   (2006.01)
   *C30B 29/46*   (2006.01)

(52) U.S. Cl.
   CPC ............ *C01B 19/007* (2013.01); *C30B 25/08* (2013.01); *C30B 29/46* (2013.01); *C01P 2002/72* (2013.01)

(58) Field of Classification Search
   CPC ....... C30B 25/08; C30B 29/45; C01B 19/007; C01P 2002/72
   See application file for complete search history.

(56) References Cited

U.S. PATENT DOCUMENTS

| | | | |
|---|---|---|---|
| 9,620,665 B1 * | 4/2017 | Bartolucci | ........ H01L 29/66969 |
| 10,407,799 B2 | 9/2019 | Zhang et al. | |
| 2001/0054375 A1 * | 12/2001 | Fujiwara | ................ C30B 25/08 117/2 |
| 2015/0064471 A1 * | 3/2015 | Dresselhaus | ............ C23C 14/12 428/408 |
| 2016/0268460 A1 * | 9/2016 | Kim | .................... H01L 31/1892 |
| 2019/0378716 A1 * | 12/2019 | Min | ........................ C23C 14/06 |

FOREIGN PATENT DOCUMENTS

| | | |
|---|---|---|
| CN | 107868981 | 4/2018 |
| JP | H10316499 | 12/1998 |

* cited by examiner

*Primary Examiner* — Robert M Kunemund
(74) *Attorney, Agent, or Firm* — ScienBiziP, P.C.

(57) ABSTRACT

A method for making a transition metal dichalcogenide crystal having a chemical formula represented as $MX_2$ is provided, wherein M represents a central transition metal element, and X represents a chalcogen element. The method includes providing a $MX_2$ polycrystalline powder, a $MX_2$ seed crystal, and a transport medium. The $MX_2$ polycrystalline powder and the transport medium are placed in a first reaction chamber. The first reaction chamber and the $MX_2$ seed crystal are placed in a second reaction chamber having a source end and a deposition end opposite to the source end. The first reaction chamber is placed at the source end, and the $MX_2$ seed crystal is placed at the deposition end.

20 Claims, 7 Drawing Sheets

METHOD FOR MAKING TRANSITION METAL DICHALCOGENIDE CRYSTAL

FIELD

The present application relates to a technical field of materials, in particular to a transition metal dichalcogenide crystal.

BACKGROUND

Transition metal dichalcogenides (TMDs) have attracted widespread attention due to their unique electrical and optical properties. The chemical formula of the transition metal dichalcogenides can be represented as $MX_2$, wherein M represents a central transition metal element (for example, IV, V, VI, VII, IX or X group element), and X represents a chalcogen element (for example, S, Se or Te).

Currently methods for making bulk transition metal dichalcogenides are by chemical vapor transport (CVT) method. However, existing CVT methods usually nucleates at multiple locations on the inner wall of the reaction chamber, which may limit the final size of the crystals and generate aggregated small crystal clusters. Thus, it is may be difficult to prepare large-sized and high-quality transition metal dichalcogenides.

Therefore, there is room for improvement in the art.

BRIEF DESCRIPTION OF THE DRAWINGS

Implementations of the present technology will now be described, by way of embodiments, with reference to the attached figures, wherein.

DETAILED DESCRIPTION

Figure 1:
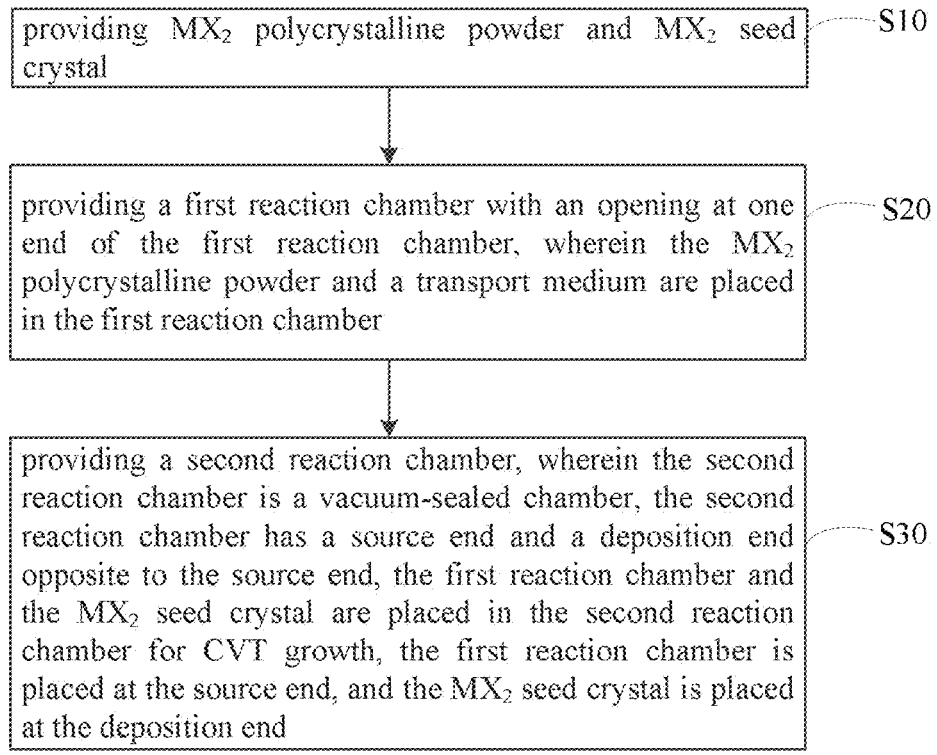
FIG. 1 shows a schematic process flow of a method for making a transition metal dichalcogenide crystal of an embodiment according to present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

An infrared absorber of a first embodiment is a carbon nanotube structure formed by stacking a plurality of drawn carbon nanotube films.

Figure 2:
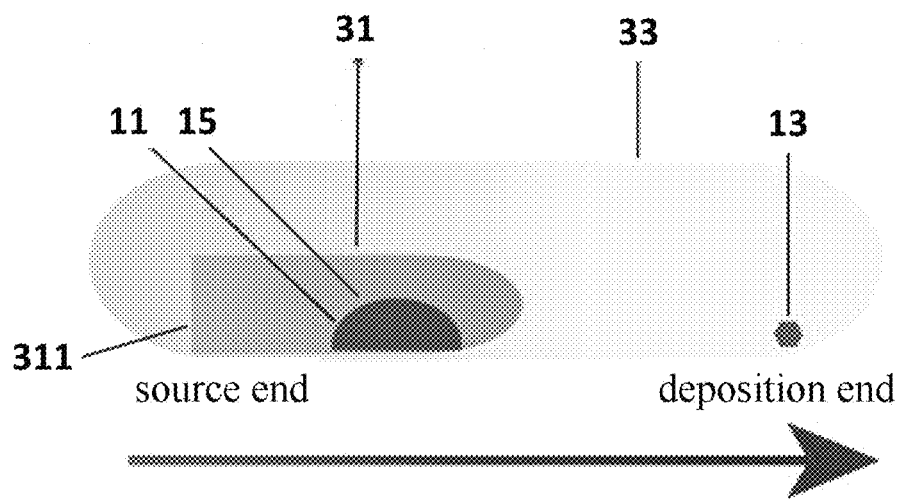
FIG. 2 shows a schematic view of a CVT device for growing a seed according to an embodiment of the present disclosure.

Referring to FIG. 1 and FIG. 2, a method for making a transition metal dichalcogenide crystal of one embodiment is provided. The chemical formula of the transition metal dichalcogenide crystal can be represented as $MX_2$, wherein M represents a central transition metal element (for example, IV, V, VI, VII, IX or X group element), and X represents a chalcogen element (for example, S, Se or Te). In one embodiment, the $MX_2$ can be $MoS_2$, $MoSe_2$, $MoTe_2$, $PtSe_2$, $PtS_2$, $PtTe_2$, $WSe_2$, $WTe_2$, $ReSe_2$, $ReS_2$, $VS_2$, $VSe_2$, $CrSe$, $CrSe_2$, $PdS_2$, $PdSe_2$, $PdTe_2$, $TiS_2$, $TiSe_2$, $NbS_2$, $NbSe_2$, $TaS_2$, $TaSe_2$, and so on.

The method for making the transition metal dichalcogenide crystal includes one or more of the following steps:

S10, providing $MX_2$ polycrystalline powder 11 and $MX_2$ seed crystal 13;

S20, providing a first reaction chamber 31 with an opening 311 at one end of the first reaction chamber 31, wherein the $MX_2$ polycrystalline powder 11 and a transport medium 15 are placed in the first reaction chamber 31; and S30, providing a second reaction chamber 33, wherein the second reaction chamber 33 is a vacuum-sealed chamber, the second reaction chamber 33 has a source end and a deposition end opposite to the source end, the first reaction chamber 31 and the $MX_2$ seed crystal 13 are placed in the second reaction chamber 33 for CVT growth, the first reaction chamber 31 is placed at the source end, and the $MX_2$ seed crystal 13 is placed at the deposition end.

During step S10, the $MX_2$ polycrystalline powder 11 is a one-hundred-micrometer-level and non-obviously shiny powder. The $MX_2$ polycrystalline powder 11 is prone to have twin crystals, grain boundaries or rough surfaces.

The $MX_2$ polycrystalline powder 11 can be obtained by direct solid-state reaction of a mixture of high purity M element and high purity X element. The high purity refers to a purity range of 99% to 99.99999%. For example, in one embodiment, the purity of Mo is 99.95%, the purity of Pt is 99.9%, the purity of Se is 99.999%, and the purity of Te is 99.999%. The above-mentioned mixture of M element and X element is gradually heated to the reaction temperature at a certain rate under vacuum conditions and remained for a period of time to obtain the $MX_2$ polycrystalline powder 11 as a precursor. The certain rate can be less than 20 Kelvin/min. In one embodiment, the mixture of M element and X element is heated to 1073 Kelvin at a rate of 5 Kelvin/min in a vacuum quartz ampoule, and is remained at 1073 Kelvin for 3 days.

The $MX_2$ seed crystal 13 is a single crystal with a size ranging from 500 μm (micrometer) to 1 mm (millimeter). The $MX_2$ seed crystal 13 has a regular shape and usually has a glossy appearance without obvious grain boundaries, twin crystals, or rough surfaces.

The $MX_2$ seed crystal 13 can be prepared by using the above-mentioned $MX_2$ polycrystalline powder 11. For example, in one embodiment, the $MX_2$ seed crystal 13 is prepared by the chemical vapor transport (CVT) method. The method for making the $MX_2$ seed crystal 13 includes the following steps:

S101, placing the $MX_2$ polycrystalline powder 11 and the transport medium 15 in a chamber for CVT growing, to obtain $MX_2$ crystal;

S102, removing the remaining transport medium 15 in the $MX_2$ crystal; and

S103, selecting the $MX_2$ crystal with a size range of 500 microns to 1 mm as the $MX_2$ seed crystal 13.

Figure 3:
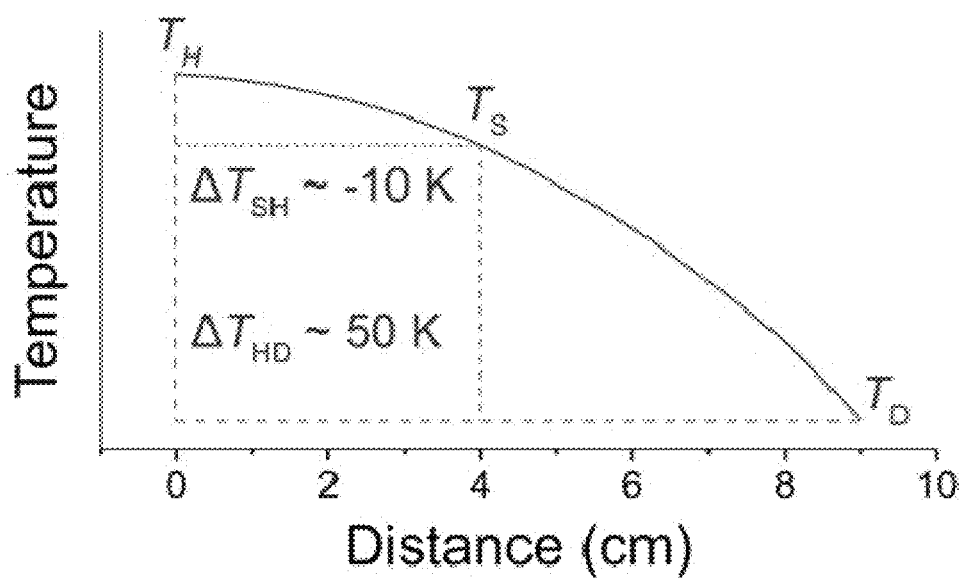
FIG. 3 shows a CVT growth temperature gradient curve of an embodiment of the present disclosure.

During step S101, the chamber is a vacuum-sealed reaction chamber, the material of the chamber can be quartz, and the chamber can be a quartz tube. The chamber is arranged horizontally within a temperature gradient, and the temperature gradient can be generated by a tube furnace that is also placed horizontally. Referring to FIG. 3, FIG. 3 shows a temperature gradient in the tube furnace, wherein $T_H$ represents the temperature in the high temperature zone (source end), $T_D$ represents the temperature in the low temperature zone (deposition end), and the temperature in the tube furnace gradually decreases from the source end to the deposition end. $\Delta T_{HD}$ represents the temperature difference between the source end and the deposition end. In one example, $\Delta T_{HD}$ is about 50K.

The transport medium 15 can be selected according to the $MX_2$ polycrystalline powder 11, for example, when the $MX_2$ polycrystalline powder 11 is $MoSe_2$, the transport medium 15 can be $SeCl_4$; when the $MX_2$ polycrystalline powder 11 is $MoTe_2$, the transport medium 15 is $TeBr_4$; and when the $MX_2$ polycrystalline powder 11 is $PtSe_2$, the transport medium 15 can be $SeCl_4$.

During step S102, the $MX_2$ crystal obtained in the step S10l can be washed with deionized water, acetone or ethanol to remove the remaining transport medium 15.

During step S103, the size of the $MX_2$ crystal selected as the $MX_2$ seed crystal 13 has certain requirements, and the size of the $MX_2$ crystal is in a range from 500 μm (micron) to 1 mm. In one embodiment, the $MX_2$ crystal should have a gloss on the surface. If it does not have a surface gloss, it indicates that the seed crystal is of poor quality, has many defects, and the surface is not smooth enough, which is not conducive to the subsequent growth of large-sized crystals. In one embodiment, the $MX_2$ crystal can be cut to a certain degree to form a regular shape, such as a regular hexagon, a regular triangle, a square, and the like.

During step S20, the material of the first reaction chamber 31 can be quartz, and one end of the first reaction chamber 31 has the opening 311. The length of the first reaction chamber 31 can be in a range from about 2 cm (centimeter) to about 6 cm. The distance between the $MX_2$ polycrystalline powder 11 and the opening 311 can be in a range from about 2 cm to about 6 cm. The minimum inner diameter of the first reaction chamber 31 is greater than 1 mm. In one embodiment, the first reaction chamber 31 is a quartz tube with a length of about 4 cm, an outer diameter of about 5 mm, and an inner diameter of about 3 mm.

The transport medium 15 of the step 20 is the same as the transport medium 15 of the step 101, and the transport medium 15 can be selected according to the $MX_2$ polycrystalline powder 11. For example, when the $MX_2$ polycrystalline powder 11 is $MoSe_2$, the transport medium 15 can be $SeCl_4$; when the $MX_2$ polycrystalline powder 11 is $MoTe_2$, the transport medium 15 can be $TeBr_4$; and when the $MX_2$ polycrystalline powder 11 is $PtSe_2$, the transport medium 15 can be $SeCl_4$.

The $MX_2$ polycrystalline powder 11 and the transport medium 15 are both placed inside the first reaction chamber 31. In one embodiment, the first reaction chamber 31 is placed horizontally, and the $MX_2$ polycrystalline powder 11 and the transport medium 15 are arranged away from the opening 311 of the first reaction chamber 31. The distance between the $MX_2$ polycrystalline powder 11 and the opening 311 ranges from about 2 cm to about 6 cm. The distance between the transport medium and the opening 311 ranges from about 2 cm to about 6 cm.

During step S30, the material of the second reaction chamber 33 can be quartz. Compared with the first reaction chamber 31, the second reaction chamber 33 has a larger volume to ensure that the first reaction chamber 31 can be inserted into the second reaction chamber 33. The length of the second reaction chamber 33 can be in a range from about 7 cm to about 11 cm. In one embodiment, the second reaction chamber 33 is a quartz tube with a length of about 9 cm, an outer diameter of about 9 mm, and an inner diameter of about 7 mm.

During CVT growth, the first reaction chamber 31 is placed at the source end, and the $MX_2$ seed crystal 13 is placed at the deposition end. In one embodiment, the opening 311 of the first reaction chamber 31 faces and closes to the end point of the second reaction chamber 33, and is away from the $MX_2$ seed crystal 13.

The second reaction chamber 33 is horizontally arranged within a temperature gradient, and the temperature gradient can be generated by a tube furnace that is also placed horizontally. Referring to FIG. 3 for the temperature gradient in the tube furnace. In FIG. 3, $T_H$ represents the temperature at the opening 311 of the first reaction chamber 31, $T_S$ represents the temperature at the position of the $MX_2$ polycrystalline powder 11 and the transport medium 15 in the first reaction chamber 31, and $T_D$ represents the temperature at the deposition end of the second reaction chamber 33, $\Delta T_{HD}$ represents the difference between the temperature at the opening 311 and the temperature at the deposition end, and $\Delta T_{SH}$ represents the temperature difference between the two opposite ends of the first reaction chamber 31. In one embodiment, $\Delta T_{HD}$ is in a range from 45K to 55K, and $\Delta T_{SH}$ is in a range from −15K to −5K. In one embodiment, $\Delta T_{HD}$ is about 50K, and $\Delta T_{SH}$ is about −10K.

Table 1 shows three groups of parameters and time required for the growth of $MX_2$ crystals ($MoSe_2$, $MoTe_2$, $PtSe_2$) using the method provided in this embodiment.

TABLE 1 the parameters and time of growing MX$_2$ crystal using
the method provided in this implementation

| | example | | |
|---|---|---|---|
| | example 1 | example 2 | example 3 |
| MX$_2$ crystal | MoSe$_2$ crystal | MoTe$_2$ crystal | PtSe$_2$ crystal |
| MX$_2$ powder (mg · cm$^{-3}$) | MoSe$_2$ (≤11.0) | MoTe$_2$ (≤6.6) | PtSe$_2$ (≤22.1) |
| transport medium (mg · cm$^{-3}$) | SeCl$_4$ (≤2.21) | TeBr$_4$ (≤3.32) | SeCl$_4$ (≤11.0) |
| T$_H$ (K) | 1223 | 1123 | 1273 |
| T$_D$ (K) | 1173 | 1073 | 1223 |
| growth time (h) | 24 | 24 | 72 |

The following provides three groups of experimental data using the existing CVT method to prepare MX$_2$ crystals as comparative data to verify that the method for making the transition metal dichalcogenide crystal of the present invention has better effect than the conventional and existing CVT method.

Figure 4:
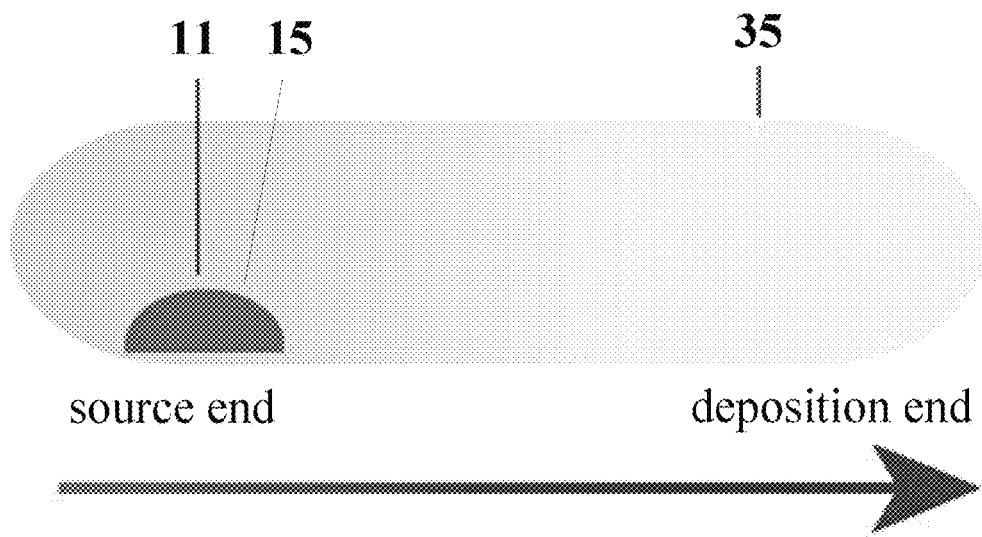
FIG. 4 shows a schematic view of a conventional CVT device for growing MX2 crystal.

FIG. 4 shows a schematic view of a conventional and existing CVT device for growing MX$_2$ crystal. The conventional and existing CVT method for growing MX$_2$ crystal used in the comparative example includes following steps:

placing the MX$_2$ polycrystalline powder 11 and the transport medium 15 in a third reaction chamber 35 for CVT growth, to obtain MX2 crystals.

The third reaction chamber 35 is a vacuum-sealed chamber, and the MX$_2$ polycrystalline powder 11 and the transport medium 15 are placed at the source end of the third reaction chamber 35. The third reaction chamber 35 is horizontally arranged in a temperature gradient, and the temperature gradient can be generated by a tube furnace that is also placed horizontally. Referring to FIG. 3 for the temperature gradient in the tube furnace. In FIG. 3, T$_H$ represents the temperature in the high temperature zone (source end), T$_D$ represents the temperature in the low temperature zone (deposition end), the temperature in the tube furnace gradually decreases from the source end to the deposition end, and ΔT$_{HD}$ represents the difference between the temperature at the source end and the deposition end. In the comparative example, ΔT$_{HD}$ is about 50K.

Table 2 shows the three groups of parameters and time required for the growth of MX$_2$ crystals using the conventional and existing CVT method.

TABLE 2 the parameters and time of using the conventional
and existing CVT method to grow MX$_2$ crystal

| | comparison example | | |
|---|---|---|---|
| | comparison example 1 | comparison example 2 | comparison example 3 |
| MX$_2$ crystals | MoSe$_2$ crystals | MoTe$_2$ crystals | PtSe$_2$ crystals |
| MX$_2$ powder (mg · cm$^{-3}$) | MoSe$_2$ (≤11.0) | MoTe$_2$ (≤6.6) | PtSe$_2$ (≤22.1) |
| transport medium (mg · cm$^{-3}$) | SeCl$_4$ (≤2.21) | TeBr$_4$ (≤3.32) | SeCl$_4$ (≤11.0) |
| T$_H$ (K) | 1223 | 1123 | 1273 |
| T$_D$ (K) | 1173 | 1073 | 1223 |
| growth time (h) | 72 | 72 | 504 |

By comparing Table 1 and Table 2, it can be found that the method for making the transition metal dichalcogenide crystal of the present application can significantly shorten the time required for the growth of MX$_2$ crystals. The growth time of MoSe$_2$, MoTe$_2$, and PtSe$_2$ crystals is respectively changed from 72 hours, 72 hours, and 504 hours are shortened to 24 hours, 24 hours, and 72 hours.

Figure 5A:
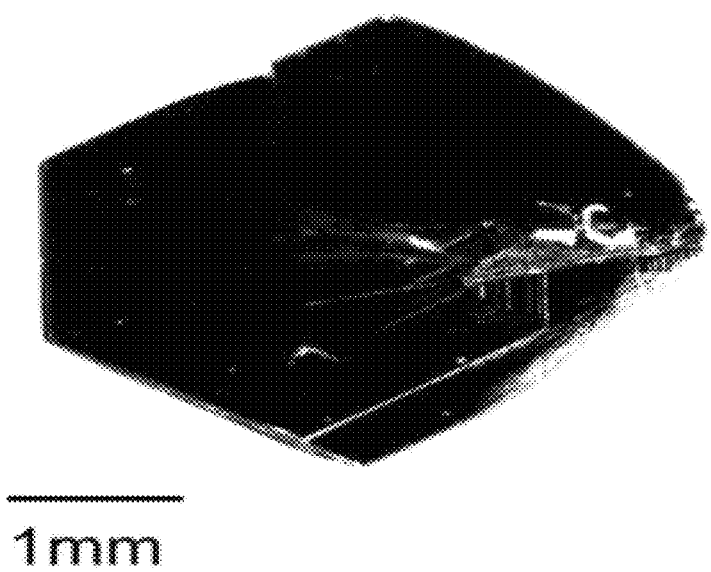
FIG. 5A shows a photo of a $MoSe_2$ crystal prepared by the method of FIG. 1.
Figure 5B:
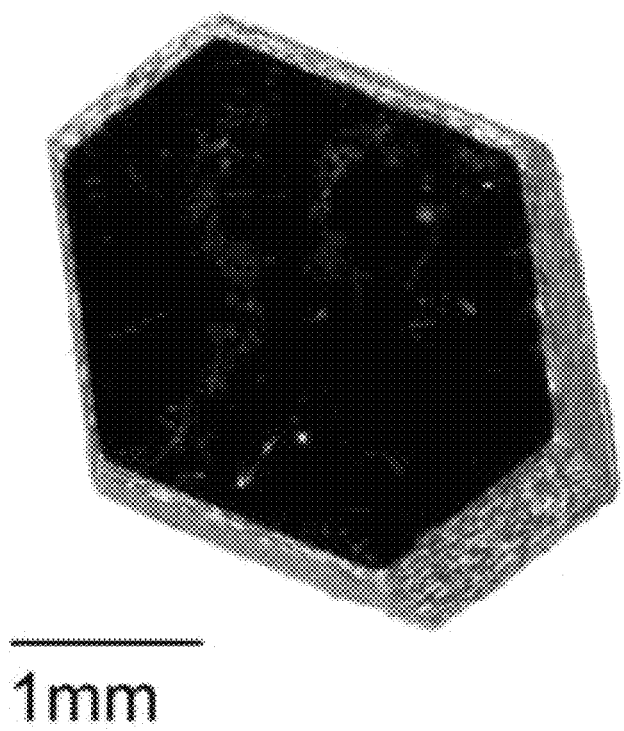
FIG. 5B shows a photo of a $MoTe_2$ crystal prepared by the method of FIG. 1.
Figure 5C:
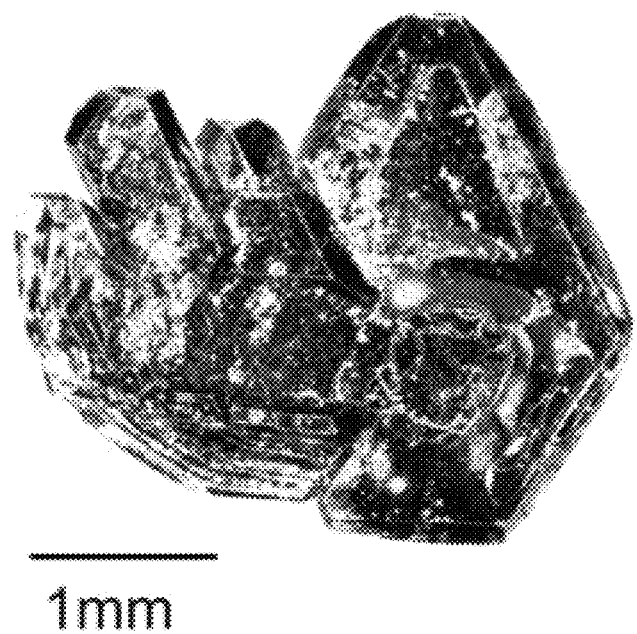
FIG. 5C shows a photo of a $PtSe_2$ crystal prepared by the method of FIG. 1.
Figure 6A:
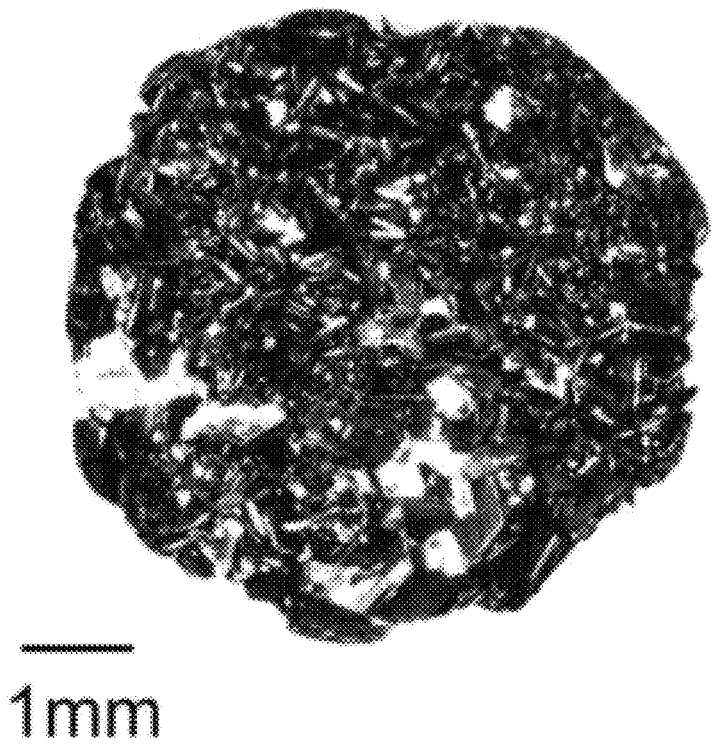
FIG. 6A shows a photo of a $MoSe_2$ crystal prepared by the conventional CVT growth method shown in FIG. 4.
Figure 6B:
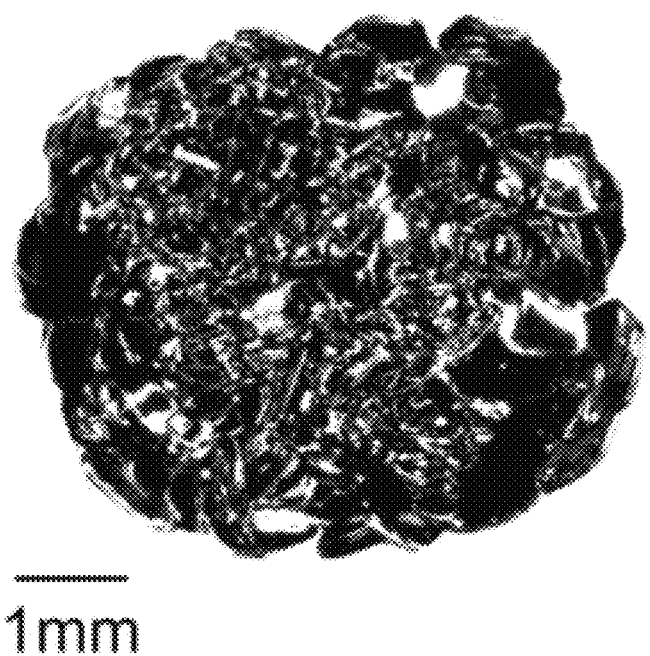
FIG. 6B shows a photo of a $MoTe_2$ crystal prepared by the conventional CVT growth method shown in FIG. 4.
Figure 6C:
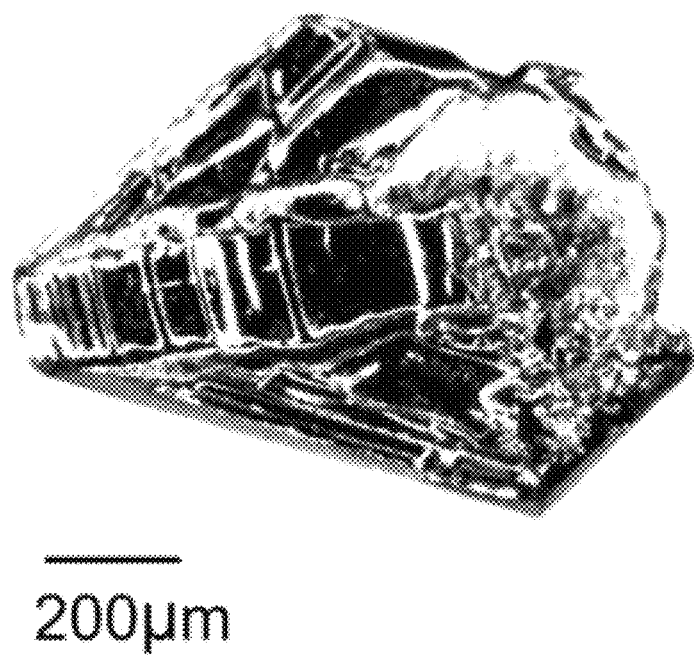
FIG. 6C shows a photo of a $PtSe_2$ crystal prepared by the conventional CVT growth method shown in FIG. 4.

FIG. 5A shows a photo of a MoSe$_2$ crystal prepared by the method for making the transition metal dichalcogenide crystal of the present application. FIG. 5B shows a photo of a MoTe$_2$ crystal prepared by the method for making the transition metal dichalcogenide crystal of the present application. FIG. 5C shows a photo of a PtSe$_2$ crystal prepared by the method for making the transition metal dichalcogenide crystal of the present application. FIG. 6A shows a photo of a MoSe$_2$ crystal prepared by the conventional CVT growth method of the comparison example 1. FIG. 6B shows a photo of a MoTe$_2$ crystal prepared by the conventional CVT growth method of the comparison example 2. FIG. 6C shows a photo of a PtSe$_2$ crystal prepared by the conventional CVT growth method of the comparison example 3. It can be seen from FIGS. 5A-5C and FIGS. 6A-6C that the products prepared by the comparative method (conventional CVT method) are generally aggregated small crystal clusters, and the size is usually limited between 500 microns and 1 mm. These aggregated small crystal clusters are difficult to apply to subsequent scientific research and Industrial applications, such as measurement of transmission properties and electronic structures, large-scale spalling, and device manufacturing. Correspondingly, the method for making the transition metal dichalcogenide crystal of the present application can obtain MoSe$_2$ crystal with a size of 3 microns and MoTe$_2$ crystal with a size of 3 microns, and the MoSe$_2$ crystal and the MoTe$_2$ crystal have regular morphologies and flat surfaces, which can be applied to subsequent scientific research and industrial applications. It can also be seen from FIGS. 5A-5C and FIGS. 6A-6C that the PtSe$_2$ crystal obtained by the method for making the transition metal dichalcogenide crystal of the present application exhibits a brighter surface.

Figure 7:
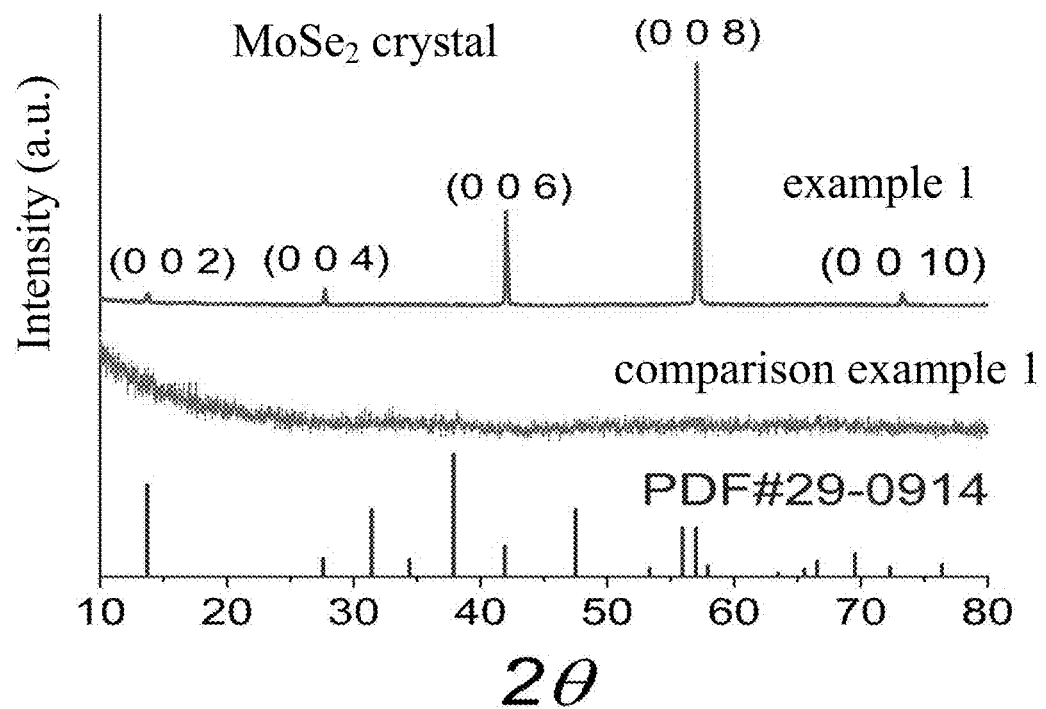
FIG. 7 shows powder X-ray diffraction (PXRD) patterns of $MoSe_2$ crystals prepared by the method of FIG. 1 of the present disclosure and by the conventional CVT growth method shown in FIG. 4.
Figure 8:
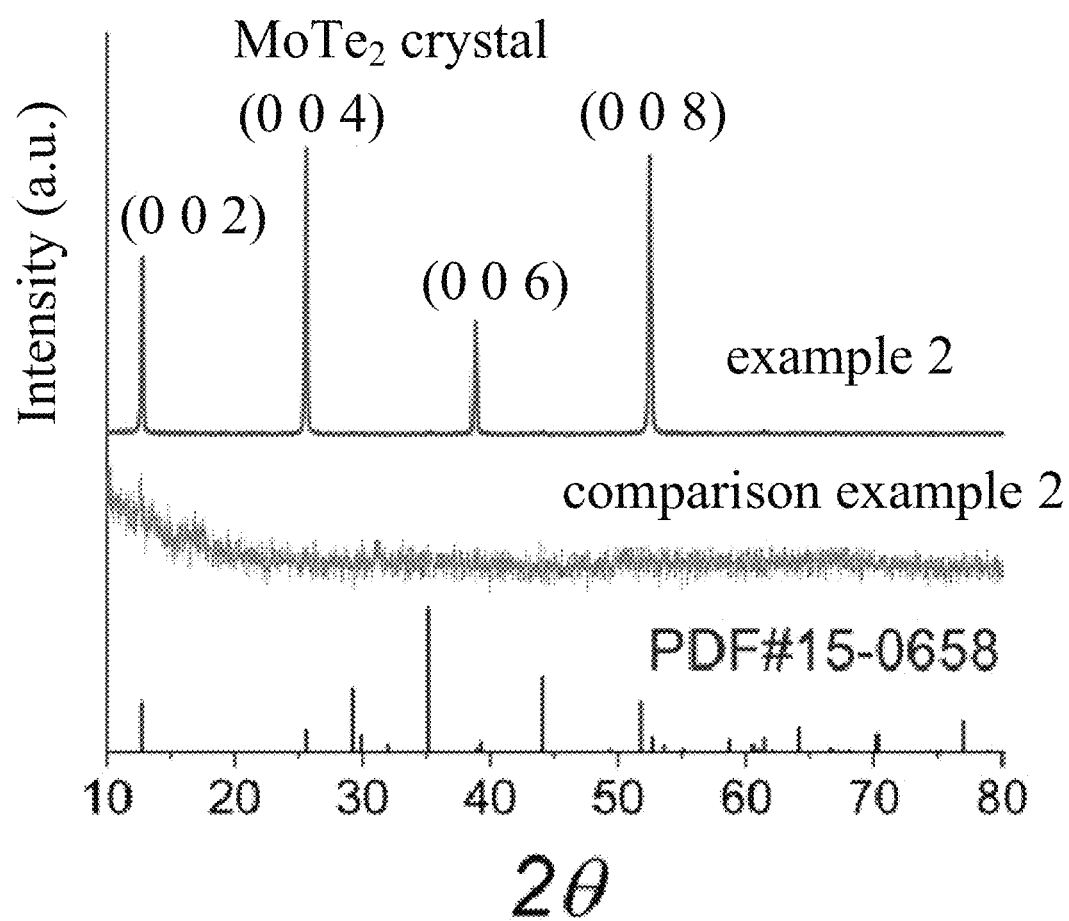
FIG. 8 shows powder X-ray diffraction (PXRD) patterns of $MoTe_2$ crystals prepared by the method of FIG. 1 of the present disclosure and by the conventional CVT growth method shown in FIG. 4.

FIG. 7 shows the PXRD patterns of the MoSe$_2$ crystals prepared by the two different methods in example 1 and comparative example 1. The comparative example 1 has no obvious peaks, while the example 1 shows sharp and strong peaks following the diffraction rule of (0 0 1), I=2n, indicating the nature of high crystallinity and the edge [0 0 1] Layers arranged in the direction. FIG. 8 shows the PXRD patterns of the MoTe$_2$ crystals prepared by the two different methods of example 2 and comparative example 2. Similarly, the comparative example 2 has no obvious peaks, while the example 2 shows sharp and intense peaks following the diffraction rule of (0 0 1), and 1=2n.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method of making a transition metal dichalcogenide crystal having a chemical formula represented as MX$_2$, wherein M represents a central transition metal element, and X represents a chalcogen element, comprising:
providing MX$_2$ polycrystalline powder, MX$_2$ seed crystals, and a transport medium;
providing a first reaction chamber defining an opening at one end of the first reaction chamber, wherein the MX$_2$ polycrystalline powder and the transport medium are placed in the first reaction chamber; and
providing a second reaction chamber comprising a source end and a deposition end opposite to the source end, wherein the first reaction chamber and the MX$_2$ seed crystals are placed in the second reaction chamber, the first reaction chamber is placed at the source end, and the MX$_2$ seed crystals are placed at the deposition end; and T$_H$ represents a temperature at the opening of the first reaction chamber, T$_S$ represents a temperature of the MX$_2$ polycrystalline powder, and T$_D$ represents a temperature at the deposition end of the second reaction chamber; and $-15$ K$<$(T$_S$-T$_H$)$<-5$ K, 45 K$<$(T$_H$-T$_D$)$<$55 K.

2. The method of claim 1, wherein the MX$_2$ polycrystalline powder is obtained by direct solid-state reactions of a mixture of the central transition metal element M and the chalcogen element X.

3. The method of claim 1, wherein the MX$_2$ seed crystals comprise a plurality of single crystals.

4. The method of claim 3, wherein average sizes of the :MX$_2$ seed crystals are in a range from 500 μm to 1 mm.

5. The method of claim 1, wherein a method for providing the MX$_2$ seed crystals comprises:
placing the MX$_2$ polycrystalline powder and the transport medium in a chamber configured for chemical vapor transport (CVT) growing, to obtain MX$_2$ crystals;
removing remaining transport medium in the MX$_2$ crystals; and
selecting the MX$_2$ crystals with sizes in a range of 500 microns to 1 mm for making the transition metal dichalcogenide crystal.

6. The method of claim 5, further comprising cutting the selected MX$_2$ crystals to form a hexagon, a triangle, or a square.

7. The method of claim 1, wherein the opening of the first reaction chamber is away from the MX$_2$ seed crystals.

8. The method of claim 1, wherein the first reaction chamber is spaced apart from the MX$_2$ seed crystals.

9. The method of claim 1, wherein the MX$_2$ polycrystalline powder and the transport medium are away from the opening of the first reaction chamber.

10. The method of claim 1, wherein a distance between the MX$_2$ polycrystalline powder and the opening is in a range from about 2 cm to about 6 cm.

11. A method for making a transition metal dichalcogenide crystal having a chemical formula represented as MX$_2$, wherein M represents a central transition metal element, and X represents a chalcogen element; and the method for making the transition metal dichalcogenide crystal, comprising:
placing a MX$_2$ polycrystalline powder and a transport medium in a first reaction chamber; and
placing the first reaction chamber and a MX$_2$ seed crystal in a second reaction chamber having a source end and a deposition end opposite to the source end, wherein the first reaction chamber is placed at the source end, and the MX$_2$ seed crystal is placed at the deposition end, and the first reaction chamber and the MX$_2$ seed crystal are spaced apart from each other; and T$_H$ represents a temperature at an opening of the first reaction chamber. T$_S$ represents a temperature of the MX$_2$ polycrystalline powder, and T$_D$ represents a temperature at the deposition end of the second reaction chamber; and $-15$ K$<$(T$_S$-T$_H$)$<-5$ K, 45 K$<$(T$_H$-T$_D$)$<$55 K.

12. The method of claim 11, wherein the MX$_2$ polycrystalline powder is obtained by direct solid-state reaction of a mixture of M element and X element.

13. The method of claim 11, wherein the MX$_2$ seed crystal is a single crystal.

14. The method of claim 13, wherein a size of the MX$_2$ seed crystal is in a range from 500 μm to 1 mm.

15. The method of claim 11, wherein a method for making the MX$_2$ seed crystal comprises:
placing the MX$_2$ polycrystalline powder and the transport medium in a chamber for CVT growing, to obtain a MX$_2$ crystal;
removing remaining transport medium in the MX$_2$ crystal; and
selecting the MX$_2$ crystal with a size range of 500 microns to 1 mm as the MX$_2$ seed crystal.

16. The method of claim 15, further comprising a step of cutting the MX$_2$ crystal to form a hexagon, a triangle, or a square, after selecting the MX$_2$ crystal with the size range of 500 microns to 1 mm as the MX$_2$ seed crystal.

17. A method of making a transition metal dichalcogenide crystal having a chemical formula represented as MX$_2$, wherein M represents a central transition metal element, and X represents a chalcogen element, comprising:
providing MX$_2$ polycrystalline powder, MX$_2$ seed crystals, and a transport medium;
providing a first reaction chamber defining an opening at one end of the first reaction chamber, wherein the MX$_2$ polycrystalline powder and the transport medium are placed in the first reaction chamber, and the opening of the first reaction chamber is away from the $MX_2$ seed crystals; and providing a second reaction chamber comprising a source end and a deposition end opposite to the source end, wherein the first reaction chamber and the $MX_2$ seed crystals are placed in the second reaction chamber, the first reaction chamber is placed at the source end, and the $MX_2$ seed crystals are placed at the deposition end.

18. The method of claim 17, wherein $T_H$ represents a temperature at the opening of the first reaction chamber, $T_S$ represents a temperature of the polycrystalline powder, and $T_D$ represents a temperature at the deposition end of the second reaction chamber; and $-15\ K < (T_S - T_H) < -5\ K$, $45\ K < (T_H - T_D) < 55\ K$.

19. The method of claim 17, wherein the $MX_2$ polycrystalline powder and the transport medium are away from the opening of the first reaction chamber.

20. The method of claim 17, wherein a distance between the $MX_2$ polycrystalline powder and the opening is in a range from about 2 cm to about 6 cm.

* * * * *